United States Patent [19]

Donoghue

[11] 4,312,047
[45] Jan. 19, 1982

[54] MEMORY ARRAY HAVING IMPROVED ISOLATION BETWEEN SENSE LINES

[75] Inventor: William J. Donoghue, Round Rock, Tex.

[73] Assignee: Motorola, Inc., Schaumberg, Ill.

[21] Appl. No.: 154,353

[22] Filed: May 29, 1980

[51] Int. Cl.³ .............................................. G11C 7/02
[52] U.S. Cl. .................................. 365/189; 365/104; 365/190; 365/206
[58] Field of Search .................. 365/94, 103, 104, 189, 365/190, 206, 207, 208

[56] References Cited

U.S. PATENT DOCUMENTS 4,237,547  12/1980  Smith ................................. 365/104

OTHER PUBLICATIONS

Hsieh, "Read and Write for Random-Access Memory Array", IBM Tech. Disc. Bul., vol. 18, No. 6, 11/75, pp. 1849-1850.

*Primary Examiner*—Stuart N. Hecker
*Attorney, Agent, or Firm*—Anthony J. Sarli, Jr.; Vincent B. Ingrassia; Jeffrey Van Myers

[57] ABSTRACT

A memory array having improved isolation between the bit sense common lines is provided by using diode connected transistors. The diode connected transistors substantially eliminate any current flow between bit sense common lines when a certain portion of the column select circuitry has not been selected. Since the blocking transistors prevent current flow there is no noise generated to be coupled to one of the control lines. This results in a memory array which can operate at higher speeds since better differential signals are established to be sensed by the sense amplifier.

8 Claims, 2 Drawing Figures

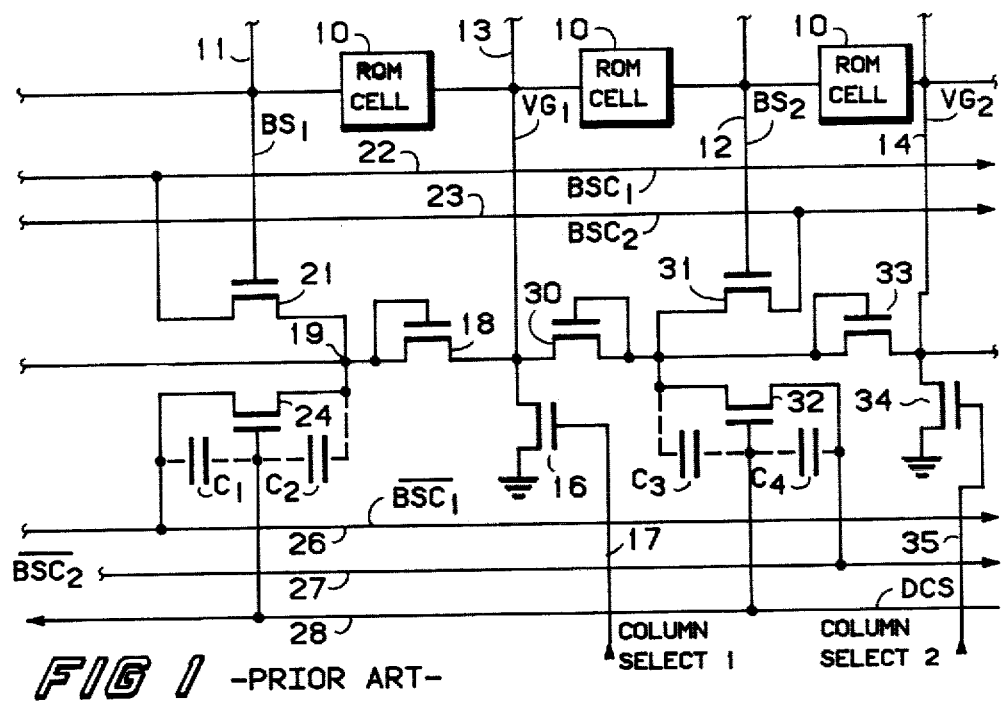
*FIG 1* —PRIOR ART—
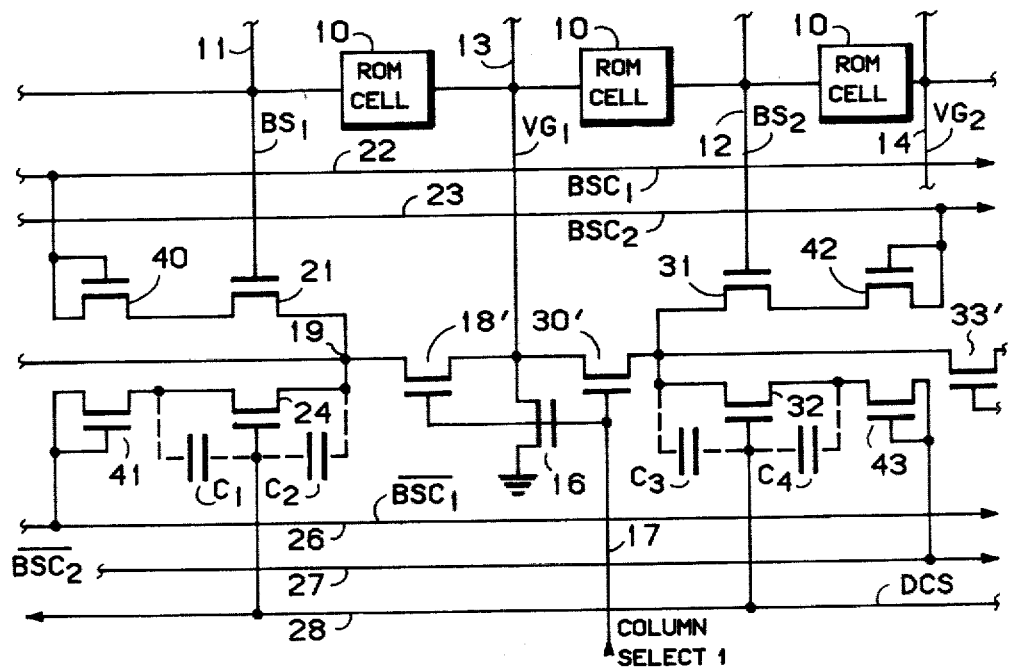
*FIG 2*

4,312,047

MEMORY ARRAY HAVING IMPROVED ISOLATION BETWEEN SENSE LINES

This invention relates, in general, to solid state integrated circuit memories, and more particularly, to a memory array having improved isolation between sense lines.

In most memories it is common to sense information stored in a given memory location by using a sense amplifier which provides an output depending upon the difference in voltage potential of two sense lines.

Many read-only-memories (ROM) have a bit sense common line and a complement bit sense line which are connected to the sense amplifier. Column select circuitry is connected to both of the bit sense lines (BS) and enables the transfer of the information carried on a bit sense (BS) line from a storage location, to the bit sense common (BSC) lines. When certain of the bit sense lines are not selected to be read from, their associated column select circuitry has a tendency to provide a path between the bit sense common line and its complement. This tends to equalize the bit sense common line and its complement thereby making it difficult for the sense amplifier to sense a difference on these lines. Also due to the parasitic capacitance associated with the column select circuitry, noise can be coupled to a dummy column select line thereby causing poor operation of the column select circuitry which is being used to transfer information from a predetermined bit sense line to the bit sense common line.

Accordingly, it is an object of the present invention to provide a memory array having improved isolation between sense lines coupled to a sense amplifier.

Another object of the present invention is to provide a memory array which has reduced noise coupling between sense lines and at least one control signal line.

Yet another object of the present invention is to provide a memory array which can sense smaller differential signals on its sense lines resulting in higher speed operation.

SUMMARY OF THE INVENTION

In carrying out the above and other objects of the present invention, there is provided, in one form, a memory array having improved isolation between a sense line and its complement. The improved isolation also reduces noise coupling to a control signal used by the column select circuitry. The improved isolation is achieved by inserting blocking means in series with transistors coupled to the bit sense common line and to its complement line and provide a blocking function when the transistors are not actively selected to transfer information from a bit sense line to the bit sense common lines.

In a preferred embodiment, the isolation or blocking means are diode connected transistors, and are used in a virtual ground ROM.

BRIEF DESCRIPTION OF THE DRAWINGS

FIG. 1 shows a portion of a prior art virtual ground ROM; and

FIG. 2 illustrates a portion of a ROM employing the present invention.

DETAILED DESCRIPTION OF THE DRAWINGS

A portion of a virtual ground ROM is illustrated in FIG. 1 having a plurality of ROM cells 10. One ROM cell 10 is shown coupled between a first bit sense ($BS_1$) line 11 and a first virtual ground ($VG_1$) line 13. A second ROM cell 10 is shown coupled between first virtual ground line 13 and a second bit sense ($BS_2$) line 12. A third ROM cell 10 is shown as being coupled between the second bit sense line 12 and a second virtual ground line 14. The rest of the ROM cells (not shown) in the memory array continue in a similar fashion having one virtual ground line serving two adjacent ROM cells. The first virtual ground line 13 is coupled to a reference potential, illustrated as ground, by field effect transistor 16. Transistor 16 has its gate electrode connected to line 17 which carries a first column select signal. A junction formed by the first virtual ground line 13 and transistor 16 is coupled to a node 19 by field effect transistor 18. Transistor 18 also has its gate electrode connected to node 19. Node 19 is coupled to a first bit sense common line ($BSC_1$) 22 by a field effect transistor 21. Transistor 21 has its gate electrode connected to the first bit sense line 11. Node 19 is also coupled to a bit sense common line ($\overline{BSC_1}$) 26 by a field effect transistor 24. Bit sense common line 26 is a complement of first bit sense common line 22. Transistor 24 has its gate electrode connected to a line 28 which carries a dummy column select signal. A parasitic capacitor $C_1$ is shown coupled from the drain of transistor 24 to its gate electrode. Also shown is parasitic capacitor $C_2$ between the source and gate electrodes of transistor 24. Parasitic capacitors $C_1$ and $C_2$ are illustrated to indicate how noise can be coupled from node 19 and bit sense common line 26 onto dummy column select line 28.

Virtual ground line 13 is also coupled to a second bit sense common line ($BSC_2$) 23 by field effect transistors 30 and 31. Transistor 30 has its gate electrode connected to its drain while transistor 31 has its gate electrode connected to second bit sense line 12. The gate and drain of transistor 30 are coupled to another bit sense common line 27 by a field effect transistor 32. Bit sense common line ($\overline{BSC_2}$) 27 is a complement of bit sense common line 23. Transistor 32 has its gate electrode connected to dummy column select line 28. Parasitic capacitors $C_3$ and $C_4$ are shown associated with the electrodes of transistor 32.

The sources of transistors 31 and 32 are also coupled to the second virtual ground line 14 by field effect transistor 33. Field effect transistor 33 has its gate electrode connected to its drain. Virtual ground line 14 is coupled by field effect transistor 34 to a reference potential illustrated as ground. Transistor 34 has its gate electrode connected to line 35 which carries a second column select signal. When the first column select signal enables transistor 16, information from bit sense line 11 is transferred to bit sense common line 22. When the second column select signal enables transistor 34, then transistor 31 transfers information from bit sense line 12 to bit sense common line 23. All the transistors illustrated in FIG. 1 are part of the column select circuitry.

Prior to performing a read operation with the memory illustrated in FIG. 1, bit sense lines 11 and 12, virtual ground lines 13 and 14, and bit sense common lines 22, 23, 26, and 27 are all precharged. If it is assumed that the second column select signal appearing on line 35 enables transistor 34 whereas the first column select signal appearing on line 17 does not enable transistor 16 during the read operation it will be noted that transistors 21 and 24 appear in series between bit sense common line 22 and bit sense common line 26. Then the bit sense line adjacent to virtual ground line 14 away from virtual ground line 13 will have its information transferred to bit sense common line 22. Bit sense line 11 was precharged and therefore can enable transistor 21 while dummy column select line 28 can enable transistor 24 thereby providing a path between bit sense common lines 22 and 26 whenever the potential between the lines becomes sufficient to cause the transistors to conduct. This tends to equalize any difference in potential between the two bit sense common lines. Since transistors 21 and 24 are enabled and it was assumed that transistor 16 is not enabled the voltage at node 19 will vary in accordance with the conduction of transistors 21 and 24. This variation is coupled by capacitor $C_2$ to line 28 which can interfere with the operation of transistor 32 since it was assumed that transistor 34 is enabled. When transistor 34 is enabled, then bit sense line 12 is selected and its information will be transferred onto bit sense common line 23 by transistor 31, and in order to sense a differential voltage between bit sense common lines 23 and 27, transistor 32 provides a complementary signal to bit sense common line 27. However, if the enabling signal for transistor 32, which is the dummy column select signal, is modified through noise coupled onto line 28 then transistor 32 may not cause the desired voltage level to be present on bit sense common line 27.

FIG. 2 illustrates the improved memory array having increased isolation between the bit sense common line and its complement. The reference numerals used in FIG. 2 are the same as used in FIG. 1 except for the new components added. In addition, transistors 18, 30, and 33 are operated in a modified manner in FIG. 2 and are therefore designated as primed numbers otherwise, the rest of the transistors operate as explained for FIG. 1. The gate electrode of transistor 18' and gate electrode of transistor 30' are connected to the gate electrode of transistor 16 so that all three transistors can be enabled by the column select signal appearing on line 17. This is a preferred arrangement for transistors 18' and 30' since it allows them to conduct more current when they are being utilized.

The improvement to the portion of the ROM illustrated in FIG. 2 is to add transistor 40 between transistor 21 and bit sense common line 22. Transistor 40 serves as a blocking means to provide additional isolation from node 19 to bit sense common line 22. Transistor 41 is added in series between transistor 24 and bit sense common line 26. Transistor 42 is added between transistor 31 and bit sense common line 23, while transistor 43 is added in series between transistor 32 and bit sense common line 27. It should be noted that added transistors 40, 41, 42, and 43 have their gate electrodes connected to their drain and act as diodes, and therefore, in order for the diode connected transistors 40-43 to conduct, the electrode having the gate connected to it must be at a higher voltage potential than the electrode not having the gate connected to it. In operation, after the precharging cycle occurs, if it is assumed that transistor 16 is not enabled then there is no current path for node 19 to discharge through since transistor 18' is not enabled. Node 19 cannot discharge through transistors 21 or 24 since transistors 40 or 41 respectively will block any current flow toward the bit sense common line. Also, it is not possible for current to flow through transistor 40 from bit sense common line 22 through transistor 21 to node 19 since node 19 is not a current sink. Since node 19 now stays at a constant potential there is no signal for $C_2$ to couple to dummy column select line 28 and $C_1$ does not have a signal to couple since the drain electrode of transistor 24 is isolated by transistor 41. The same applies for parasitic capacitors $C_3$ and $C_4$.

During a normal read operation where transistor 16 is enabled and ROM cell 10 coupled between bit sense line 11 and virtual ground line 13 contains a logic "1", then bit sense line 11 will start discharging at a faster rate than dummy column select line 28 discharges. This means that the precharge voltage on bit sense common line 22 will not be discharged as low as will the precharge voltage appearing on bit sense common line 26. Since bit sense common line 22 and bit sense common line 26 are connected to the same sense amplifier which provides an output proportional to the differential between bit sense common line 22 and bit sense common line 26 it is important that the differential be easily detectable. Isolation transistors 40 and 41 do not interfere with the normal operation of the circuit when their associated transistors are being utilized; however, they do provide the needed isolation when their associated transistors 21 and 24 are not being utilized. Since now noise cannot be coupled from node 19 to line 28 the dummy column select signal will not be degraded and it will always provide the same discharge rate to the bit sense common line through the transistor that is being utilized.

By now it should be appreciated that there has been provided a memory array having improved isolation between its bit sense common lines and noise coupling to one of the control signal lines is virtually eliminated. The improved isolation between the bit sense common lines allows a better differential voltage to be established between them which means that the sense amplifier can sense the differential faster thereby speeding up the operation of the memory.

I claim:

1. A read-only-memory having a plurality of storage cells and a plurality of bit sense lines, and virtual ground lines located between the bit sense lines, comprising: a first transistor coupled from each of the virtual ground lines to a reference potential; at least a first and a second bit sense common line; a second transistor coupled from the first bit sense common line to one of the virtual ground lines; a third transistor coupled from the second bit sense common line to the one of the virtual ground lines; a first diode connected transistor coupled between the second transistor and the first bit sense common line; a second diode connected transistor coupled between the third transistor and the second bit sense common line; a first signal coupled to the first transistor to enable the first transistor; and a second signal coupled to the third transistor to enable the third transistor, wherein the second transistor is enabled by one of the bit sense lines.

2. The read-only-memory of claim 1 wherein the transistors are field effect transistors.

3. The read-only-memory of claim 1 further including a fourth transistor coupled between the first transistor and the second and third transistors.

4. A memory array having a plurality of memory cells and having improved isolation between a first and a second sense lines, comprising: at least one return line which serves as a return line for two adjacent memory cells; at least one bit line coupled to one of the two adjacent memory cells; a first transistor coupled from the at least one return line to a node; a second transistor coupled to the node and to the at least one bit line; first blocking means coupled between the second transistor and the first sense line to substantially block current flow when the at least one bit line is non-selected; a third transistor coupled to the node and being enabled by a first signal; and second blocking means coupled between the third transistor and the second sense line wherein the first and second blocking means provide additional isolation between the first and second sense lines.

5. The memory array of claim 4 further including a fourth transistor coupled from the at least one return line to a reference potential and being enabled by a second signal.

6. The memory array of claim 5 wheren the transistors are field effect transistors.

7. The memory array of claim 4 wherein the first transistor is enabled by the second signal.

8. The memory array of claim 4 wherein the first and second blocking means are diode connected field effect transistors.

* * * * *